United States Patent
Huang et al.

(10) Patent No.: US 7,613,269 B2
(45) Date of Patent: Nov. 3, 2009

(54) METHOD FOR CALCULATING EQUAL ERROR PROTECTION PROFILES

(75) Inventors: Chung-Jung Huang, Hsinchu (TW); Tsai-Sheng Kao, Keelung (TW)

(73) Assignee: KeyStone Semiconductor Corp., Hsinchu (TW)

( * ) Notice: Subject to any disclaimer, the term of this patent is extended or adjusted under 35 U.S.C. 154(b) by 522 days.

(21) Appl. No.: 11/309,683

(22) Filed: Sep. 11, 2006

(65) Prior Publication Data
US 2007/0258545 A1 Nov. 8, 2007

(30) Foreign Application Priority Data
May 2, 2006 (TW) .............................. 95115549 A

(51) Int. Cl.
*H04L 23/00* (2006.01)
(52) U.S. Cl. ..................... 375/377; 714/699; 714/701; 714/746; 714/774; 714/790; 714/799
(58) Field of Classification Search ................. 375/265, 375/316, 340–341, 377; 714/699, 799, 701, 714/746, 774, 790
See application file for complete search history.

(56) References Cited

U.S. PATENT DOCUMENTS

| 5,812,601 | A  | * | 9/1998 | Schramm | ..................... 375/262 |
| 6,347,122 | B1 | * | 2/2002 | Chen et al. | ................... 375/262 |
| 6,768,778 | B1 | * | 7/2004 | Chen et al. | ................... 375/262 |
| 7,190,737 | B2 | * | 3/2007 | Okamoto | ..................... 375/286 |

* cited by examiner

*Primary Examiner*—Jean B Corrielus
(74) *Attorney, Agent, or Firm*—Jianq Chyun IP Office

(57) ABSTRACT

A method for calculating equal error protection (EEP) profiles is disclosed. The method uses a profile function related to a sub-channel size to calculate EEP profiles and then uses the EEP profiles to decode data. When a receiver receives a protection level and a size value of the sub-channel size, a corresponding sub-channel size can be rapidly obtained through a reference table of the protection level and the sub-channel size so as to calculate the required EEP profiles. The method in the present invention requires only a few adders/subtractors and shifters or an easily realizable multiplier to calculate the profiles so that the objective of effectively saving cost and rapidly obtaining the profiles is achieved.

7 Claims, 4 Drawing Sheets

| Bit rate of data (kbit/s) | P | L1 | L2 | PI1 | PI2 |
|---|---|---|---|---|---|
| 8n | 4-A | 4n-3 | 2n+3 | 8 | 2 |
| 8n | 3-A | 6n-3 | 3 | 8 | 7 |
| 8<br>8n(n>1) | 2-A | 5<br>2n-3 | 1<br>4n+3 | 13<br>14 | 12<br>13 |
| 8n | 1-A | 6n-3 | 3 | 24 | 23 |

FIG. 1 (PRIOR ART)

| Bit rate of data (kbit/s) | P | L1 | L2 | PI1 | PI2 |
|---|---|---|---|---|---|
| 32n | 4-B | 24n-3 | 3 | 2 | 1 |
| 32n | 3-B | 24n-3 | 3 | 4 | 3 |
| 32n | 2-B | 24n-3 | 3 | 6 | 5 |
| 32n | 1-B | 24n-3 | 3 | 10 | 9 |

FIG. 2 (PRIOR ART)

| Protection level | 1-A | 2-A | 3-A | 4-A |
|---|---|---|---|---|
| Sub-channel size | 12n | 8n | 6n | 4n |

FIG. 3 (PRIOR ART)

| Protection level | 1-B | 2-B | 3-B | 4-B |
|---|---|---|---|---|
| Sub-channel size | 27n | 21n | 18n | 15n |

FIG. 4 (PRIOR ART)

| P | L1 | L2 |
|---|---|---|
| 4-A | X−3 | X>>1+3 |
| 3-A | X−3 | 3 |
| 2-A<br>2-A(n>1) | 5<br>X>>2−3 | 1<br>X>>1+3 |
| 1-A | X>>1−3 | 3 |

FIG. 7

| P | L1 |
|---|---|
| 4-B | (X/5)<<3−3 |
| 3-B | (X/6)<<3−3 |
| 2-B | (X/7)<<3−3 |
| 1-B | (X/9)<<3−3 |

FIG. 8

METHOD FOR CALCULATING EQUAL ERROR PROTECTION PROFILES

CROSS-REFERENCE TO RELATED APPLICATION

This application claims the priority benefit of Taiwan application serial no. 95115549, filed on May 2, 2006. All disclosure of the Taiwan application is incorporated herein by reference.

BACKGROUND OF THE INVENTION

1. Field of the Invention

The present invention relates to a method for calculating equal error protection profiles, and more particularly, to a method for effectively calculating equal error protection profiles in Eureka-147 digital audio broadcasting system.

2. Description of Related Art

At present, the Eureka-147 digital audio broadcasting (DAB) system uses a punctured convolutional encoder capable of providing equal error protection (EEP) data service. At the receiving end of the punctured convolutional encoder, the EEP profiles must be captured through a suitable channel decoder According to the Eureka-147 system standard, the EEP profiles are classified into a data set A and a data set B according to whether the data rate is 8n kilobits per second (8n kbit/s) or 32n kilobits per second (32n kbits/s). The value of n in the 8n kbits/s data rate class is a positive integer between 1 to 216 and the value of n in the 32n kbits/s data rate class is a positive integer between 1 to 57. The aforementioned EEP profiles have different values corresponding to different protection levels. Their relationships are described in the EEP profile data tables shown in FIGS. 1 and 2. FIG. 1 is a data table that corresponds to a data bit rate of 8n, and FIG. 2 is a data table that corresponds to a data bit rate of 32n.

However, the data obtained through the channel decoder include the protection level and the sub-channel size only. Moreover, different protection levels correspond to different sub-channel sizes. Their relationships are shown as tables in FIGS. 3 and 4. FIG. 3 is a table that corresponds to a data bit rate of 8n, and FIG. 4 is a table that corresponds to a data bit rate of 32n.

In particular, the EEP profiles, including L1, L2, PI1 and PI2 (refer to FIGS. 1 and 2), must be determined through the obtained data. At the 8n kbits/s data rate, both the EEP profiles PI1 and PI2 are fixed constants. Therefore, the EEP profiles PI1 and PI2 can be easily obtained through the given protection level. Similarly, at the 32n kbits/s rate, the EEP profiles L3, PI1 and PI are fixed constants so that they can be determined rapidly. However, the remaining profiles L1 and L2 in the data set A and the remaining profile L1 in the data set B still have to be obtained by an appropriate method.

One method for directly calculating the EEP profiles includes dividing the sub-channel size directly by a constant when the data of the data set A or the data set B is selected. The constant is determined according to the pre-provided protection level. FIG. 5 is a block diagram showing a conventional channel decoder for decoding EEP profiles. As shown in FIG. 5, a calculating circuit 510 in the channel decoder 500 receives a batch of externally input protection level and sub-channel size data. Then, according to the protection level and sub-channel size relationships in FIGS. 3 and 4, a sub-channel size relation $x=a*n$ corresponding to the protection level is found. Next, the size value S of the previously received sub-channel size is substituted into the foregoing relation. That is, the value of S is divided by the coefficient 'a' to obtain an integer value n.

Next, the calculated value of n is transmitted to the calculation and table look-up circuit 520 of the channel decoder 500. In the meantime, the calculation and look-up circuit 520 also receives the protection level data. According to the initial protection level data, the EEP profile data tables in FIGS. 1 and 2 are utilized to find the profile function $y=b*n+c$ corresponding to the EEP profiles L1, L2, PI1 and PI2 at this protection level.

Finally, the previously calculated n value is substituted into the foregoing profile function to obtain the values of the EEP profiles L1, L2, PI1 and PI2, and then these profiles are utilized to decode the received data.

However, the foregoing method of calculating an integer value of n demands mathematical computations involving multiple divisions and multiplications. Therefore, more multiplexers and adders have to be added to the circuit so that the complexity of the hardware design is increased considerably.

Another method is a table look-up method that includes pre-storing the values of various EEP profiles corresponding to different n values in the EEP profile data table. Hence, after solving the integer value of n, the corresponding EEP profiles can be directly found by referring to the look-up table, thereby significantly reducing the amount of mathematical computations. Yet, this method demands the deployment of a large number of storage units, which is somewhat impractical.

SUMMARY OF THE INVENTION

Accordingly, at least one objective of the present invention is to provide a method for calculating equal error protection (EEP) profiles such that the EEP profiles are represented as a mathematical relation of a sub-channel size. Hence, only a few adders/subtractors and shifters or an easily realizable multiplier is needed to calculate the required profiles, thereby effectively saving cost and rapidly obtaining the profiles.

To achieve these and other advantages and in accordance with the purpose of the invention, as embodied and broadly described herein, the invention provides a method for calculating equal error protection (EEP) profiles. The method is suitable for calculating EEP profiles according to a size function $x=a*n$ and a profile function $y=b*n+c$, wherein a, b, n are positive integers and c is an integer. Furthermore, the calculated EEP profiles are used to decode data with a first bit rate. The calculation includes the following steps. First, a receiver is used to receive a batch of protective levels and a batch of size values S of sub-channel size, wherein $S=a*n$ and S is a positive integer. Then, set $b/a=z*2^m$ so that the profile function is represented by $y=(z*2^m)*S+c$. Next, the value of z and m are found using a calculating unit. Here, m is an integer and z is any number greater than zero. Afterwards, the calculating unit is used to calculate $(z*2^m)*S+c$ and obtain the profile y. If m=0, then the size value S is directly used in the calculation. If m>0, then a shifter is used to shift the bits of the size value S forward by |m| digits; and, if m<0, then the foregoing shifter is used to shift the bits of the size value S backward by |m| digits.

According to the preferred embodiment of the present invention, the foregoing method for calculating the EEP profiles further includes outputting the profile y through an output unit.

According to the foregoing method for calculating the EEP profiles in the preferred embodiment of the present invention, if c>0 in the profile function $y=(z*2^m)*S+c$, then an adder is used to execute the addition operation.

According to the foregoing method for calculating the EEP profiles in the preferred embodiment of the present invention, if c<0 in the profile function $y=(z*2^m)*S+c$, then a subtractor is used to execute the subtraction operation.

According to the foregoing method for calculating the EEP profiles in the preferred embodiment of the present invention, the bit rate includes 8n kbits/s and 32n kbits/s.

According to the foregoing method for calculating the EEP profiles in the preferred embodiment of the present invention, in the profile function $y=(z*2^m)*S+c$, $z=1/d$ and the method of calculating the profiles includes the following steps. First, the calculating unit is utilized to calculate $z=1/d=z'+err$, wherein $S*err \leq k$ and k is a natural number. Then, the largest integer not greater than $S*z'+k$ is taken to be F. Finally, the calculating unit is utilized to calculate $F*2^m+c$ and obtain the profile y.

According to the foregoing method for calculating the EEP profiles in the preferred embodiment of the present invention, when k=1, the smallest integer not smaller than $S*z'$ is taken to be the value of F.

The present invention uses only a few adders/subtractors and shifters to calculate the required profiles. Therefore, the objective of effectively saving cost and rapidly obtaining the profiles is achieved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1 and 2 are EEP profile data tables.

FIGS. 3 and 4 are sub-channel size data table.

FIG. 7 is a data table showing the correspondence between the protection level and the profiles when the bit rate is 8n kbits/s according to one embodiment of the present invention.

FIG. 8 is a data table showing the correspondence between the protection level and the profiles when the bit rate is 32n kbits/s according to one embodiment of the present invention.

DESCRIPTION OF THE PREFERRED EMBODIMENTS

Figure 5:
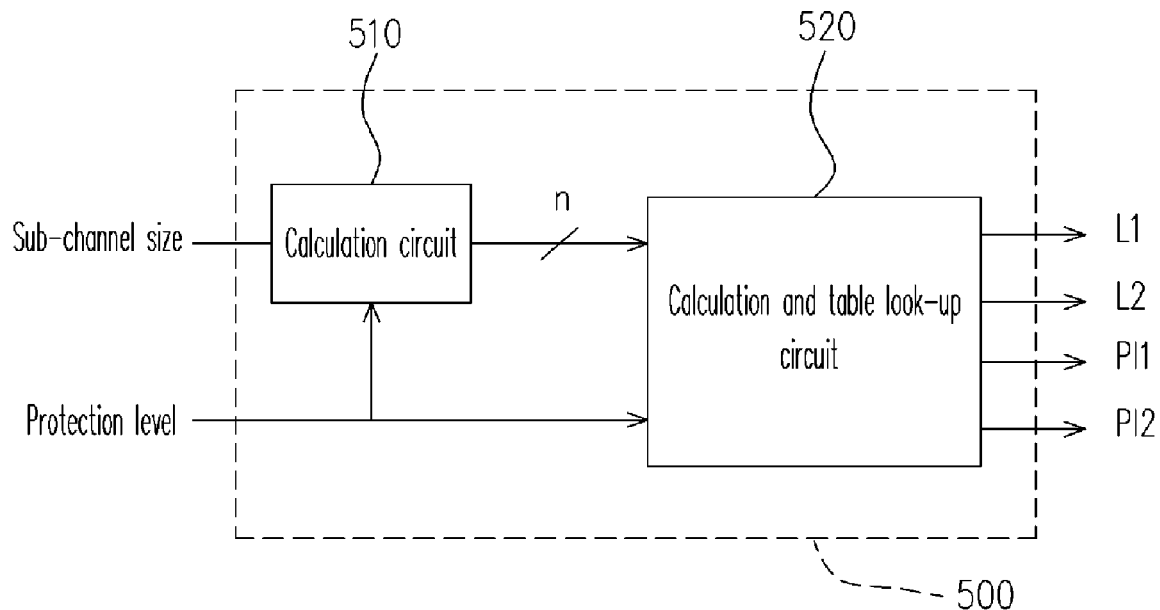
FIG. 5 is a block diagram showing a conventional channel decoder for decoding EEP profiles.

Reference will now be made in detail to the present preferred embodiments of the invention, examples of which are illustrated in the accompanying drawings. Wherever possible, the same reference numbers are used in the drawings and the description to refer to the same or like parts.

Figure 6:
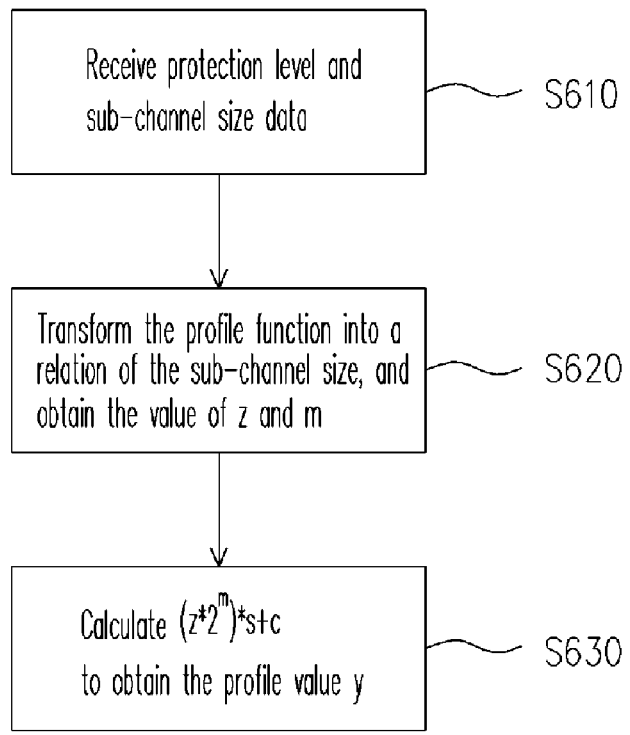
FIG. 6 is a flowchart showing the steps for calculating the EEP profiles according to one preferred embodiment of the present invention.

FIG. 6 is a flowchart showing the steps for calculating the equal error protection (EEP) profiles according to one preferred embodiment of the present invention. As shown in FIG. 6, the present embodiment includes receiving a set of protection level and sub-channel size data. According to the protection level, a corresponding size function $x=a*n$ is found. Then, the size value S of the sub-channel size is substituted into a profile function $y=b*n+c$ corresponding to the protection level, thereby calculating and obtaining the profile y of the EEP profiles.

First, a channel decoder receives a batch of externally input protection levels and sub-channel size data (step S610). The sub-channel size data includes a size value S that corresponds to a sub-channel size, wherein $S=a*n$ and S is a positive integer.

Then, the profile function $y=b*n+c$ is converted into a relation of the sub-channel size, that is, $b/a=z*2^m$, and the profile function is replaced by $y=(z*2^m)*S+c$. After that, a calculating unit is utilized to obtain the value of z and m (step S620), wherein m is an integer and z is any number greater than zero.

Next, the calculating unit is utilized to calculate $(z*2^m)*S+c$ to obtain the profile y (step S630). The method of calculating $2^m*S$ includes the following. If m=0, the size value S is directly used. If m>0, then a shifter is used to shift the bits of the size value S forward by |m| digits; and, if m<0, then a shifter is used to shift the bits of the size value S backward by |m| digits.

For example, if the profile function $y=(z*2^m)*S+c$ includes a $2^m$ multiplication operation (for example, $y=f(S)=2*S$), wherein m is a positive integer, then a shifter is used to shift the bits of the previously received size value S (for example, $S=0110_2=6$) of the sub-channel size forward by 1 digit (that is, $1100_2=12=2*S$) to obtain the effect of multiplying by 2 so that the profile is subsequently obtained. Similarly, if the profile function $y=(z*2^m)*S+c$ includes a $2^m$ division operation (for example, $y=f(S)=S/2$), then a shifter is used to shift the bits of the previously received size value S (for example, $S=0110_2=6$) of the sub-channel size backward by 1 digit (that is, $0011_2=3=S/2$) to obtain the effect of dividing by 2 so that the profile is subsequently obtained.

In addition, multiplying by $2^m$ in the $2^m*S$ calculation can be achieved by horizontally shifting the bits of the size value S left or right by m digits in a circuit. Therefore, the time required to calculate $2^m*S$ is significantly reduced and the circuit components required to implement such a mathematical operation is very much simplified.

Furthermore, if c>0 in the foregoing profile function $y=(z*2^m)*S+c$, then an adder can be used to execute the addition operation. On the other hand, if c<0, then a subtractor can be used to execute the subtraction operation.

Finally, after calculating the profile y, the profile y is output to the decoder circuit through an output unit and the decoder circuit decodes a stream of digital data at a definite bit rate. The bit rate of the foregoing digital data can be 8n kbits/s or 32n kbits/s, but the actual range is unrestricted.

One embodiment of the present invention, with reference to FIGS. 1 and 3, is used for calculating the value of the EEP profiles L1 and L2 at a bit rate of 8n kbits/s. As shown in FIG. 3, when the received protection level is 4-A, the size function corresponding to the sub-channel size is 4*n from the look-up table in FIG. 3 and the sub-channel size is represented by X (that is, X=4*n).

As shown in FIG. 1, the profile function corresponding to the EEP profiles L1 and L2 at the protection level 4-A are 4*n−3 and 2*n−3 respectively. Then, the previously looked-up size function of the sub-channel size is substituted into the profile functions of the EEP profiles L1 and L2 so that the profile functions of the EEP profiles L1 and L2 are transformed into X−3 and X/2+3 respectively. Similarly, the foregoing method can be used to obtain the profile functions of the EEP profiles L1 and L2 corresponding to other protection levels. The results are grouped together in FIG. 7. The profile function of the EEP profile L2 at the protection level 4-A is recorded to be X>>1+3. The foregoing profile function X>>1+3 indicates that the 2 bit X is shifted to the right by 1 bit and then three is subsequently added so that the value is equivalent to X/2+3. The remaining EEP profiles are obtained using an identical method.

Another embodiment of the present invention, with reference to FIGS. 2 and 4, is used for calculating the value of the EEP profile L1 at a bit rate of 32n kbits/s. As shown in FIG. 4, when the received protection level is 4-A, the size function corresponding to the sub-channel size is 15*n from the look-up table in FIG. 3 and the sub-channel size is represented by X (that is, X=15*n).

As shown in FIG. 1, the profile function corresponding to the EEP profiles L1 at the protection level 4-A is 24*n−3. Then, the previously looked-up size function of the sub-channel size is substituted into the profile function of the EEP profile L1 so that the profile function of the EEP profile L1 is transformed into 8*X/5−3. Similarly, the foregoing method can be used to obtain the profile functions of the EEP profile L1 corresponding to other protection levels. The results are grouped together in FIG. 8. The profile function of the EEP profile L2 at the protection level 4-A is recorded to be (X/5)<<3−3. The foregoing profile function (X/5)<<3−3 indicates that the 2 bit X is shifted to the left by 3 bits and then three is subsequently subtracted so that the value is equivalent to 8*X/5−3. The remaining EEP profiles are obtained using the identical method.

However, if in one embodiment, the foregoing profile function $y=(Z*2^m)*S+c$ includes a divisor d which is an integer other than power of 2 (for example, ⅕, ⅙, ⅐ and ⅑), then the method of calculating the profile includes using a calculating unit to calculate $z=1/d=z'+err$, wherein $S*err \leq k$ and k is a natural number, using the biggest integer not greater than $S*z'+k$ to be the value of F, and using the calculating unit to calculate $F*2^m+c$ and obtain the profile y. Here, note that z' is obtained by directly truncating z, and err is the quantization error. When k=1, the smallest integer not smaller than $S*z'$ is taken to be the value of F to calculate the profile y. The foregoing method is able to remove the drawback of prior techniques of having to use a multiplier with an infinite bit length (for example, in calculating 1/7=0.142857 . . . ). Thus, the correct result can be obtained using the simplest and finite width operation.

In summary, the present invention utilizes a profile function related to the sub-channel size to calculate the values of the EEP profiles. Therefore, a shifter can be directly used to calculate the values of EEP profiles containing a multiple of $2^m$ and only a few adders/subtractors are required to calculate the profiles. Because a large number of multiplexers, adders or storage units in the conventional method are not required, the objective of effectively saving cost and rapidly obtaining the profiles is achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of calculating equal error protection (EEP) profiles, suitable for calculating the EEP profiles according to a size function $x=a*n$ and a profile function $y=b*n+c$, wherein a, b and n are positive integers and c is an integer, and using the EEP profiles to decode a stream of data at a bit rate, comprising:

using a receiver to receive a protection level and a size value S of a sub-channel size, wherein $S=a*n$ and S is a positive integer;

setting $b/a=z*2^m$ so that the profile function is represented by $y=(z*2^m)*S+c$ and using a calculating unit to obtain the values of z and m, wherein m is an integer and z is any number greater than zero; and using the calculating unit to calculate $(z*2^m)*S+c$ and obtain a profile y, wherein if m=0, then the size value S is directly used in the calculation, if m>0, then a shifter is used to shift the bits of the size value S forward by |m| digits, and if m<0, then a shifter is used to shift the bits of the size value S backward by |m| digits.

2. The method of calculating the EEP profiles of claim 1 further comprises:

outputting the profile y through an output unit.

3. The method of calculating the EEP profiles of claim 1, wherein, if c>0 in the profile function $y=(z*2m)*S+c$, then an adder is used to execute the addition operation.

4. The method of calculating the EEP profiles of claim 1, wherein, if c<0 in the profile function $y=(z*2^m)*S+c$, then a subtractor is used to execute the subtraction operation.

5. The method of calculating the EEP profiles of claim 1, wherein the bit rate of the stream of data is 8n kbits/s or 32 kbits/s.

6. The method of calculating the EEP profiles of claim 1, wherein, if z=1/d in the profile function $y=(z*2^m)*S+c$, then the method of calculating the profile y comprises the steps of:

using the calculating unit to calculate $z=1/d=z'+err$, wherein $S*err \leq k$ and k is a natural number;

using the greatest integer not greater than $S*z'+k$ to be the value of F; and using the calculating unit to calculate $F*2^m+c$ to obtain the profile y, wherein d is an integer other than power of 2, z' is obtained by directly truncating z, and err is the quantization error.

7. The method of calculating the EEP profiles of claim 6, wherein, when k=1, the smallest integer not smaller than $S*z'$ is taken to be the value of F.

* * * * *